(12) United States Patent
Lee et al.

(10) Patent No.: US 6,206,706 B1
(45) Date of Patent: Mar. 27, 2001

(54) ELECTRICAL CONNECTOR

(75) Inventors: Da Ching Lee, Tai-Chung; Ming Chuan Wu, Su-Lin, both of (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/429,848

(22) Filed: Oct. 28, 1999

(30) Foreign Application Priority Data

Apr. 9, 1999 (TW) ................................................ 88205503

(51) Int. Cl.⁷ .................................................. H01R 12/00
(52) U.S. Cl. ............................................... 439/74; 439/637
(58) Field of Search ............................. 439/74, 83, 630, 439/637, 660

(56) References Cited

U.S. PATENT DOCUMENTS

| | | | |
|---|---|---|---|
| 5,137,454 | * | 8/1992 | Baechtle ................................ 439/637 |
| 5,626,500 | * | 5/1997 | Yoshimura ........................... 439/637 |
| 5,639,265 | * | 6/1997 | Nishio et al. ........................ 439/637 |
| 5,800,213 | * | 9/1998 | Regnier et al. ...................... 439/637 |
| 5,836,773 | * | 11/1998 | McHugh et al. ........................ 439/74 |
| 5,971,800 | * | 10/1999 | Azuma et al. ........................ 439/502 |

* cited by examiner

Primary Examiner—Tulsidas Patel
(74) Attorney, Agent, or Firm—Wei Te Chung

(57) ABSTRACT

An electrical connector includes an elongate insulative housing and a plurality of terminals. The housing forms an engaging slot and a plurality pairs of passageways exposed to the engaging slot for receiving corresponding terminals therein. Each terminal forms a plurality of fixing sections on a middle section thereof. The fixing sections are spaced from each other a distance whereby a possible buckling of the terminal when inserting it into the housing is prevented. An obstruction portion comprising a folded portion and a pair of projections is formed on the terminal proximate a circuit board for inhibiting wicking of flux. A spacing recess is formed in the housing opposite the engaging slot and proximate a circuit board. A pair of positioning posts is formed on a bottom surface of the housing proximate the spacing recess for engaging with corresponding holes formed in the circuit board. A plurality of receiving slots is formed in lateral surfaces of the spacing recess proximate the circuit board for engaging with the folded portions of the terminals. A rib is formed in the spacing recess for strengthening the insulative housing.

8 Claims, 6 Drawing Sheets

ELECTRICAL CONNECTOR

BACKGROUND OF THE INVENTION

The present invention relates to a board-to-board electrical connector, and particularly to an electrical connector for signal transmission between different circuit boards.

A conventional board-to-board electrical connector is disclosed in Taiwan Patent Application No. 84203014. Referring to FIG. 1, the electrical connector has an insulative housing 2 and a plurality of terminals 1 received in passageways 20 formed in the housing 2. A soldering portion 11 is formed at an end of each terminal 1 for being soldered to a circuit board 3 and securing the electrical connector thereon. A contacting portion 12 is formed on an opposite end of the terminal 1. A fixing portion 10 is formed on the terminal 1 proximate the soldering portion 11 for engaging with the insulative housing 2 and securing the terminal 1 in the corresponding passageway 20. A bottom portion of the passageway 20 receives the soldering portion 11 of the terminal 1 whereby the soldering portion is parallel to the circuit board 3. When soldering the electrical connector to the circuit board 3, molten solder may enter the housing 2 through the passageways 20 allowing solder flux to wick up the terminals 1 possibly leading to a short circuit being formed between the terminals 1. In the conventional design, the fixing portion 10 is distanced from the contacting portion 12, and the terminal 1 may easily buckle when an insertion force is exerted thereon for inserting the terminal 1 into the housing 12.

BRIEF SUMMARY OF THE INVENTION

A main object of the present invention is to provide an electrical connector having an insulative housing and a plurality of terminals, each terminal having a plurality of fixing sections for securing the terminal to the housing, and an obstruction portion formed in each terminal for obstructing wicking of solder flux.

Another object of the present invention is to provide an electrical connector having an insulative housing and a plurality of terminals, each terminal having a plurality of fixing sections distanced from each other for preventing buckling of the terminal during assembly.

To fulfill the above-mentioned object, according to a preferred embodiment of the present invention, an electrical connector includes an elongate insulative housing and a plurality of terminals. The housing forms an engaging slot and a plurality of pairs of passageways exposed to the engaging slot for receiving corresponding terminals therein. Each terminal forms a plurality of fixing sections on a middle section thereof. The fixing sections are spaced from each other a distance whereby a possible bucking of the terminal when inserting it into the housing is prevented. An obstruction portion comprising a folded portion and a pair of projections is formed on the terminal proximate a circuit board for preventing wicking of flux. A spacing recess is formed in the housing opposite the engaging slot and proximate a circuit board. A pair of positioning posts is formed on a bottom surface of the housing proximate the spacing recess for engaging with corresponding holes formed in the circuit board. A plurality of receiving slots is formed in lateral surfaces of the spacing recess proximate the circuit board for engaging with the folded portions of the terminals. A rib is formed in the spacing recess for strengthening the insulative housing.

Other objects, advantages and novel features of the invention will become more apparent from the following detailed description when taken in conjunction with the accompanying drawings.

DETAILED DESCRIPTION OF THE INVENTION

Figure 1:
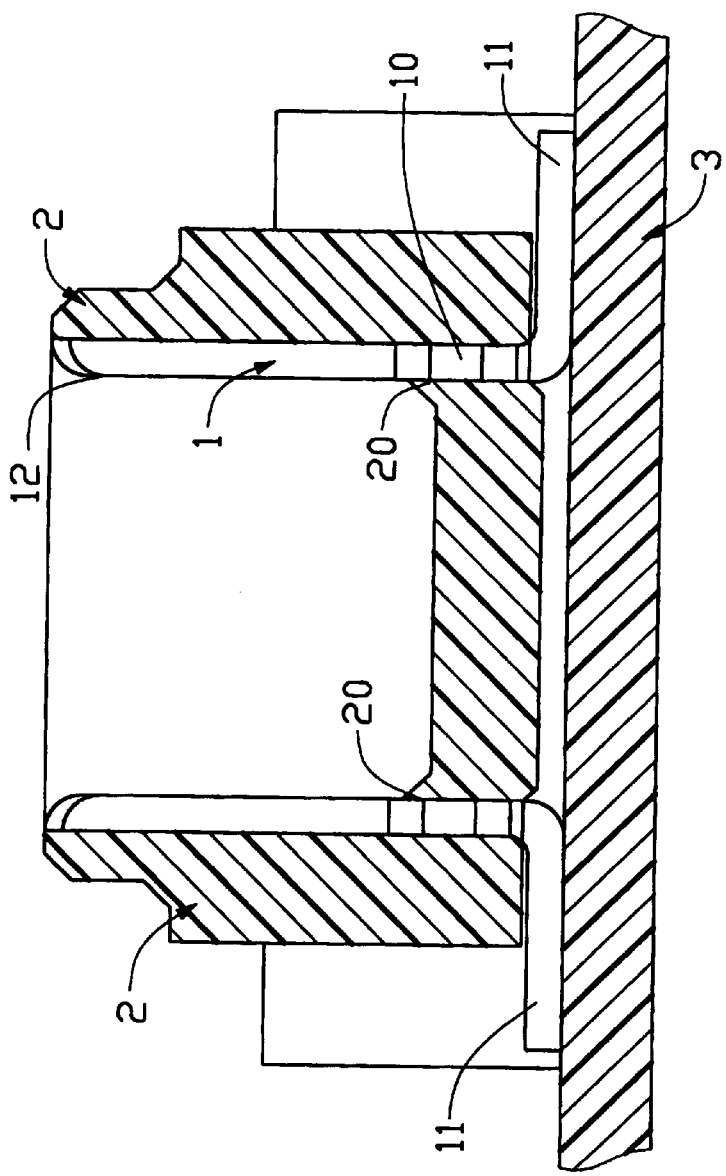
FIG. 1 is a cross-sectional view of a conventional electrical connector mounted on a printed circuit board.
Figure 2:
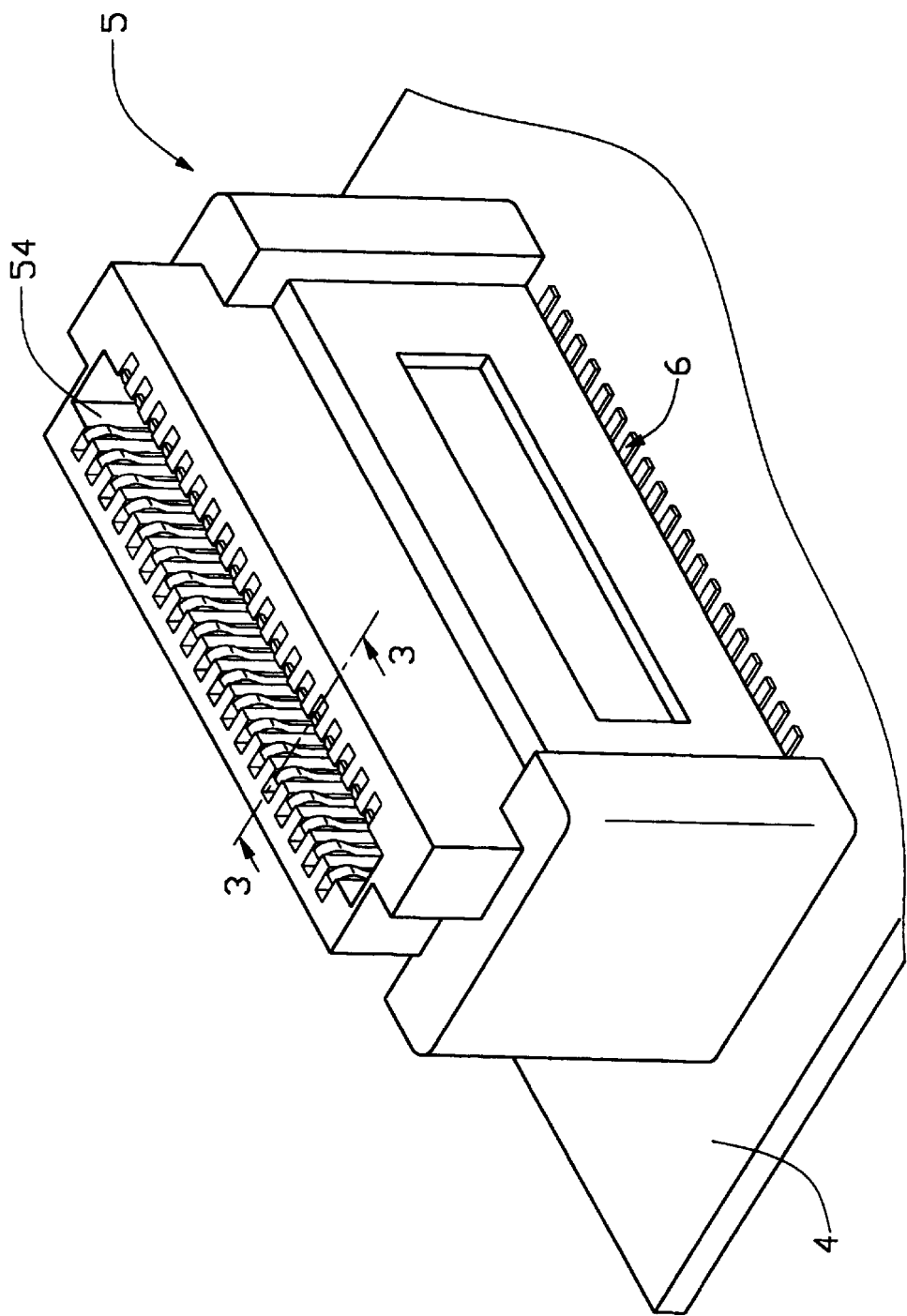
FIG. 2 is a perspective view of an electrical connector in accordance with the present invention mounted on a printed circuit board.

Referring to FIG. 2, an electrical connector comprises an elongate insulative housing 5 and a plurality of terminals 6 received in the housing 5 for electrically contacting a mating connector (not shown). The electrical connector is mounted on a circuit board 4.

Figure 3:
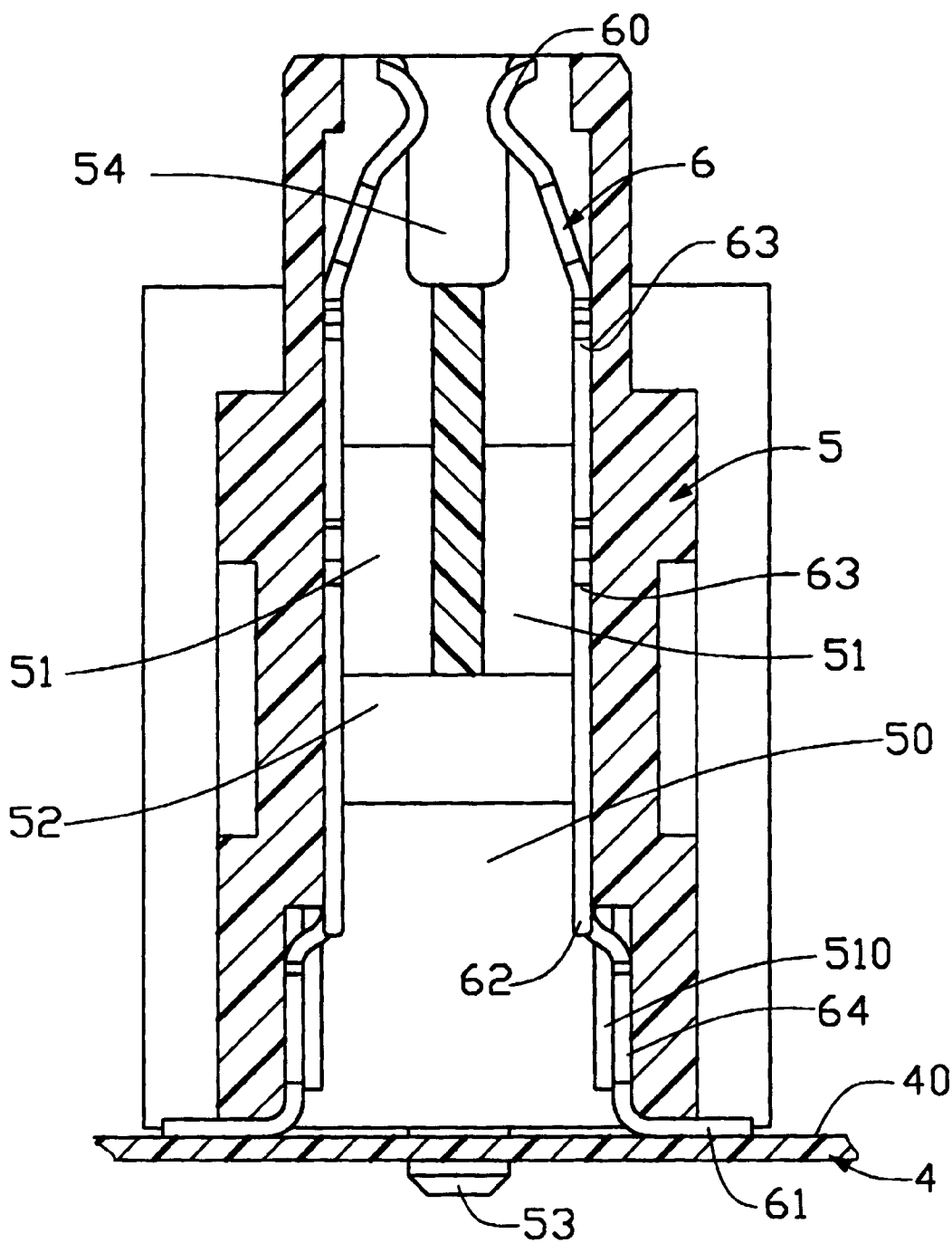
FIG. 3 is a cross-sectional view taken along line 3—3 of FIG. 2.
Figure 4:
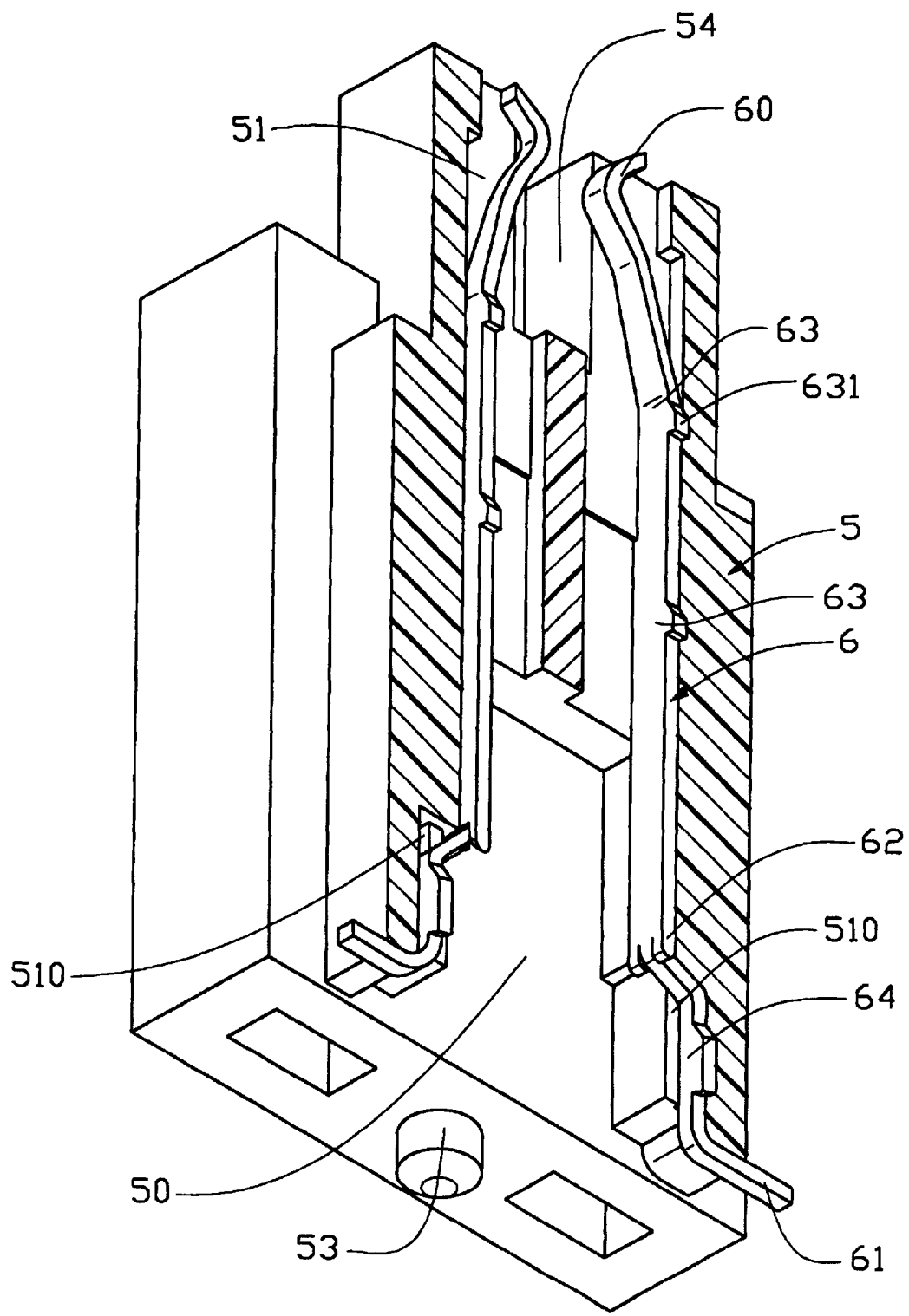
FIG. 4 is a perspective, cross-sectional view of the electrical connector.
Figure 5:
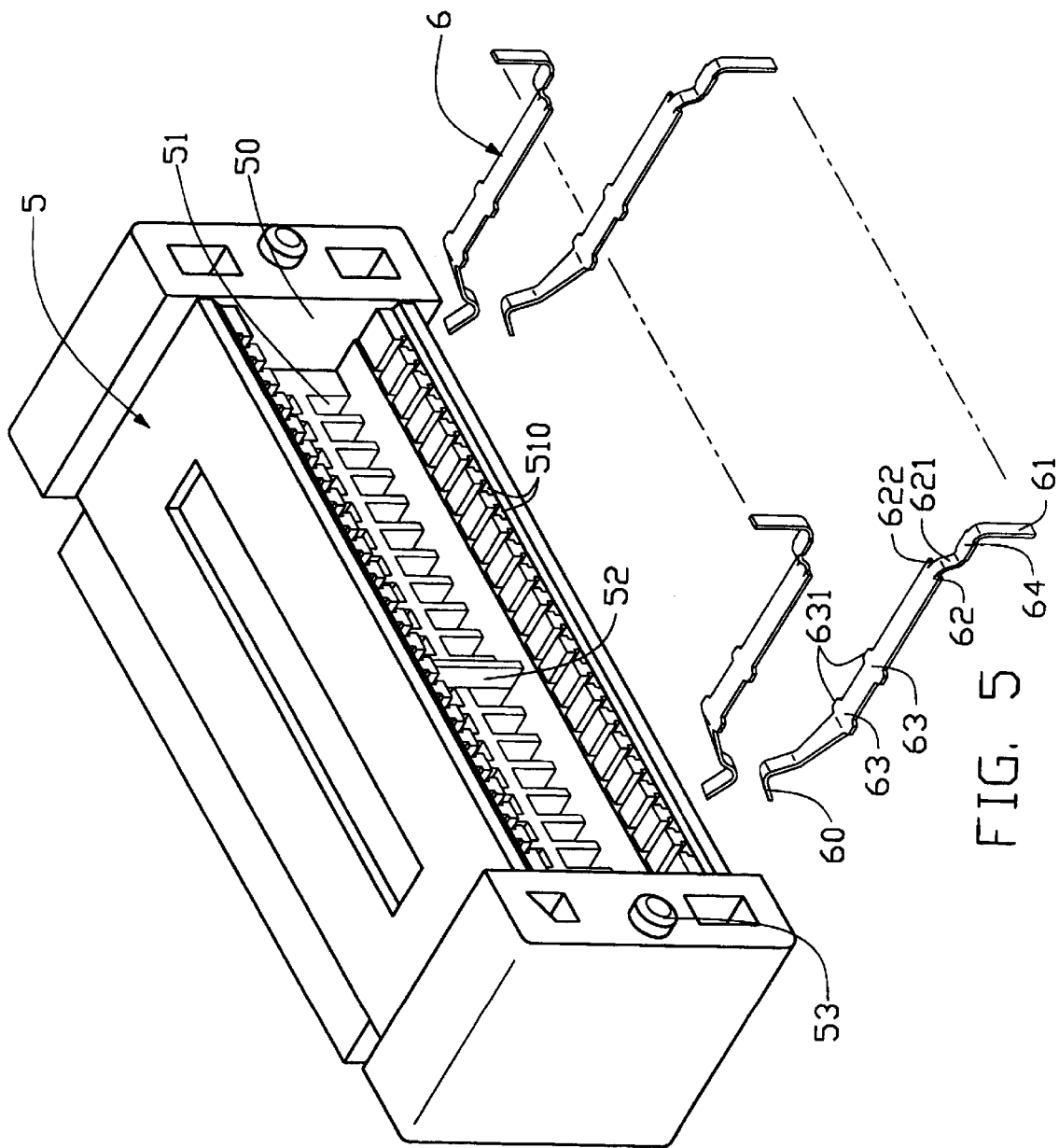
FIG. 5 is an exploded view of the electrical connector.

Referring to FIGS. 3 to 5, the housing 5 forms an engaging slot 54 and a plurality of passageways 51 exposed to the engaging slot 54 for receiving the terminals 6. A spacing recess 50 is formed in the housing 5 in communication with the engaging slot 54 and proximate the circuit board 4. A pair of positioning posts 53 is formed on a bottom surface of the housing 5 proximate the spacing recess 50 for engaging with corresponding holes (not shown) formed in the circuit board 4. A plurality of T-shaped receiving slots 510 is formed in lateral surfaces of the spacing recess 50 proximate the circuit board 4 for engaging with the terminals 6. A rib 52 is formed in the spacing recess 50 for strengthening the insulative housing 5 and preventing side walls of the housing 5 from buckling when the connector is subject to an IR reflow for soldering the terminals 6 to the circuit board 4.

The terminals 6 are received in the corresponding passageways 51. A contacting portion 60 formed proximate a free end of the terminal 6 extends into the engaging slot 54 for electrically contacting a mating connector. An opposite end of the terminal 6 extends through the spacing recess 50 and forms a soldering portion 61 for being soldered to a corresponding solder pad (not shown) formed on the circuit board 4. An obstruction portion 62 is formed on each terminal 6 and positioned in the spacing recess 50. Each obstruction portion 62 comprises a folded portion 621 and a pair of projections 622 proximate the folded portion 621. During the soldering process, the obstruction portion 62 wicking of solder flux and the formation of a short circuit between adjacent terminals 6. Two fixing sections 63 are formed on a middle portion of the terminal 6. Each fixing section 63 includes a pair of barbs 631 for engaging with the housing 5 and securing the terminals 6 therein. A fitting portion 64 is formed proximate the soldering portion 61 of the terminal 6 for engaging with the housing 5 and securing the soldering portion 61 in the corresponding receiving slot 510. The fixing sections 63 and the fitting portion 64 are distanced from each other for enhancing the reliability of securing the terminal 6 in the housing 5. The soldering portion 61 is properly positioned for being soldered to the solder pad.

Figure 6:
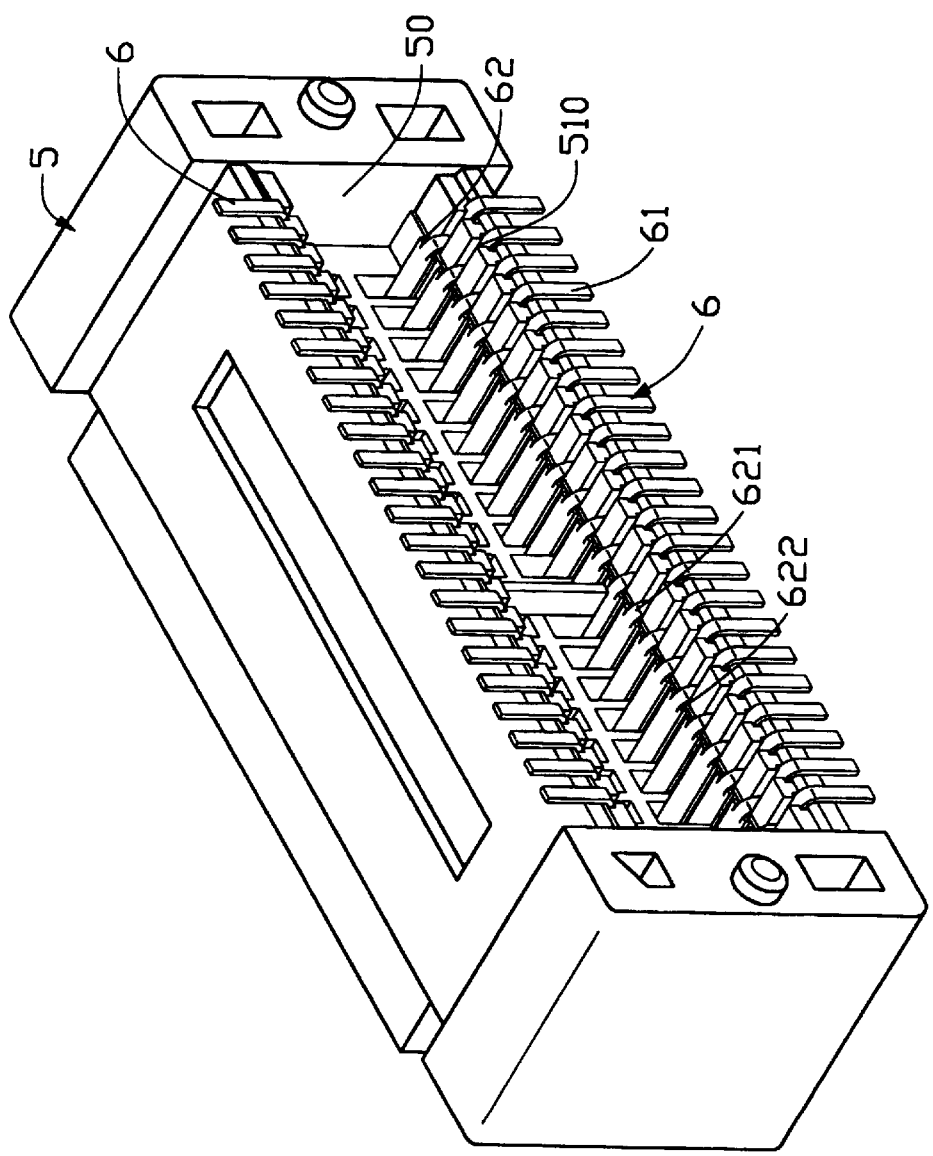
FIG. 6 is an assembled view of FIG. 5.

Further referring to FIGS. 5 and 6, in assembly, each terminal 6 is inserted into the corresponding passageway 51.

The fixing sections 63 are distanced from each other for minimizing a retention force exerted on inner walls of the passageway 51 and for reducing deformation of the terminal 6. The soldering portion 61 of the terminal 6 is positioned in the corresponding receiving slot 510 for being soldered to the corresponding solder pad formed on the circuit board 4. During the soldering process, wicking of solder flux is minimized due to the provision of the spacing recess 50 and the obstruction portions 62.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector for mounting to a circuit board, comprising:

an insulative housing having an elongate body defining an engaging slot, a plurality of passageways exposed to the engaging slot, and a spacing recess opposite the engaging slot and proximate [a] the circuit board; and a plurality of terminals received in corresponding passageways, each terminal comprising a contacting portion formed at a free end thereof and extending into the engaging slot for electrically contacting a mating connector, a soldering portion formed on an opposite end thereof and extending through the spacing recess for being soldered to a solder pad of the circuit board, an obstruction portion positioned in the spacing recess above the soldering portion for preventing solder flux from flowing upward thereto, and a pair of fixing sections between the contacting portion and the soldering portion, each fixing section being distanced from each other for balancing and enhancing the strength of the terminal thereby minimizing deformation of the terminal when inserting the terminal into the housing, each terminal further comprising a fitting portion offset from the fixing sections, said fitting portion engaging with the insulative housing and securing the soldering portion.

2. The electrical connector as claimed in claim 1, wherein the fixing sections are formed on a middle portion of the terminals and each includes a pair of barbs formed on opposite edges of each terminal.

3. The electrical connector as claimed in claim 1, wherein the obstruction portion comprises a folded portion and a pair of projections, the obstruction portion being positioned in a receiving slot formed in the spacing recess of the housing.

4. The electrical connector as claimed in claim 1, wherein the spacing recess defines an open space proximate the circuit board for preventing soldering wetting.

5. The electrical connector as claimed in claim 1, wherein a rib is formed in the spacing recess for strengthening the housing.

6. An electrical connector for mounting to a circuit board, comprising:

an insulative housing having an elongated body defining an engaging slot, a plurality of passageways exposed to the engaging slot, and a spacing recess opposite to the engaging slot and adapted to be proximate the circuit board, a plurality of T-shaped receiving slots communicatively positioned by two sides of the spacing recess; and a plurality of terminals received within the corresponding passageways, each of said terminals including a contacting portion formed at a free end thereof and extending into the engaging slot for electrically contacting a mating connector, a fitting portion formed on an opposite end thereof and extending into a corresponding T-shaped receiving slots, an obstruction portion formed above the fitting portion and including a horizontal folded portion and a pair of vertical projections thereabouts, said obstruction portion extending along the housing and confronting said spacing recess; wherein solder flux is efficiently prevented from upwardly moving along the fitting portion of the terminal due to provision of the obstruction portion and communication between the T-shaped receiving slot and the spacing recess.

7. An electrical connector for mounting to a circuit board, comprising:

an insulative housing having an elongated body defining an engaging slot, a plurality of passageways exposed to the engaging slot, and a spacing recess opposite to the engaging slot and adapted to be proximate the circuit board, a plurality of receiving slots positioned by two sides of the spacing recess; and a plurality of terminals received within the corresponding passageways, each of said terminals including a contacting portion formed at a free end thereof and extending into the engaging slot for electrically contacting a mating connector, a fitting portion formed on an opposite end thereof and extending into a corresponding receiving slot, a middle portion between said contacting portion and said fitting portion, a horizontal obstruction portion extending from the fitting portion and connecting with the middle portion so as to offset the fitting portion from the middle portion in a horizontal direction, wherein both the middle portion and the offset fitting portion include respective fixing sections spaced from each other so as to balance and enhance the strength of the terminal thereby minimizing deformation of the terminal when inserting the terminal into the housing.

8. The electrical connector as claimed in claim 7, wherein the fixing sections of the middle portion each include a pair of barbs formed on opposite edges of each terminal.

* * * * *